United States Patent [19]

Gillard et al.

[11] 4,366,395

[45] Dec. 28, 1982

[54] CIRCUIT FOR CONTROLLING THE GRID POTENTIAL OF A PULSED X-RAY TUBE

[75] Inventors: Richard G. Gillard, Kenilworth; Colin C. Oliver, Slough, both of England

[73] Assignee: EMI Limited, Hayes, England

[21] Appl. No.: 201,527

[22] Filed: Oct. 28, 1980

[30] Foreign Application Priority Data

Nov. 21, 1979 [GB] United Kingdom ................. 7940211

[51] Int. Cl.³ ...................... H03K 17/12; H03K 17/28

[52] U.S. Cl. .................................... 307/246; 307/243; 307/595

[58] Field of Search ............... 307/246, 243, 592, 595, 307/597; 328/267, 66, 67

[56] References Cited

U.S. PATENT DOCUMENTS 3,602,825 8/1971 Senior ............................ 307/246 X 3,643,111 2/1972 Deyo ............................... 307/246 X

*Primary Examiner*—John S. Heyman

*Attorney, Agent, or Firm*—Cooper, Dunham, Clark, Griffin & Moran

[57] ABSTRACT

The output of the circuit is connected to the grid of an X-ray tube (X) by a long cable having a large capacitance ($C_c$). A 25 kHz variable amplitude drive circuit (1) applies a continuous DC regulating voltage to a first rail (RL2) via a first transformer (T1), rectifier (D1, D2) and a filter (F1). A 25 kHz fixed amplitude drive circuit (2) periodically generates a blanking voltage which is applied to a second rail (RL3) via a second transformer (T2), rectifier (D3, D4) and a Zener diode (Z1). The first rail (RL2) is coupled to the second rail (RL3) via a clamping diode ($D_c$) which is reversed biased by the blanking voltage, so that the regulating voltage is overriden. In order to quickly discharge the large capacitance ($C_c$) to achieve a rapid transition from blanking voltage to regulating voltage, a discharge path is connected across the output, the path including a transistor (T1). A control circuit (3) comprises a capacitor (C2) which stores an actuating voltage ($V_T$) produced when the blanking voltage is produced. The circuit (3) also comprises an RC network (R1, C1), in parallel with the control circuit capacitor (C2), the RC junction being connected to the base of the transistor (T1) and to the second rail (RL3). When the blanking voltage is produced the RC junction is maintained at a high voltage and the transistor (T1) is non conductive. During the transition from blanking to regulating, the RC network defines a desired transition voltage which is applied by the transistor (T1) to the second rail (RL3) and this controls the discharge of the cable capacitance.

8 Claims, 3 Drawing Figures

C
B
C
B
C

GRID PULSE DRIVE

-450V
WITHIN 5V OF CONTROL LEVEL AFTER 50μS
GRID PULSE

BLANKING VOLTAGE TRANSFORMER
25 KHZ

DRIVE TO CONTROL VOLTAGE TRANSFORMER

+670V PEAK
0v
VOLTAGE ON C2 WRT CATHODE

T
-670V PEAK
A
T
VOLTAGE ON C1 WRT CATHODE

CIRCUIT FOR CONTROLLING THE GRID POTENTIAL OF A PULSED X-RAY TUBE

The present invention relates to a circuit for producing a potential for application to a control grid interposed between the anode and cathode of an X-ray tube for pulse modulating the flow of current between the anode and the cathode.

An X-ray tube for pulsed operation comprises an anode, a cathode and a control grid interposed between the anode and the cathode. An operating circuit applies a control potential to the grid to pulse modulate the current flow between the anode and cathode. Conventionally, the operating circuit is connected to the tube by a long cable which has a large capacitance, which leads to difficulties in producing abrupt transitions between the voltages applied to the grid to pulse modulate the current flow.

It is an object of the present invention to provide a circuit for producing a control potential for application to the grid such that a pulsed current flow can be produced in the tube in which there is a rapid transition from a current flow period to a period in which the current flow is substantially suppressed and vice versa.

According to the invention, there is provided a circuit for producing a control voltage for application to a control grid interposed between an anode and a cathode of an X-ray tube to produce a pulse-modulated current flow in the tube, the circuit comprising:

- a first voltage generator for generating a first voltage for regulating the said current flow;
- a second voltage generator for periodically generating a second voltage for suppressing the said current flow;
- an output for connection to a cable for connecting the circuit to the tube;
- means connecting the output to the generators such that the second voltage, when generated, overrides the first voltage;
- a discharge path connected across the output of the circuit to provide a discharge path for the discharge of the capacitance of the cable, the path including a controllable switching means connected between the outputs of the first and second voltage generators,
- means for deriving an actuating voltage from the second generator when the second voltage is produced; and a control means arranged to be actuated by the actuating voltage and responsive to the cessation of the second voltage to produce a control signal for controlling the switching means to complete the discharge path and define a desired transition between the application of the first and second voltages to the output of the circuit.

Figure 1:
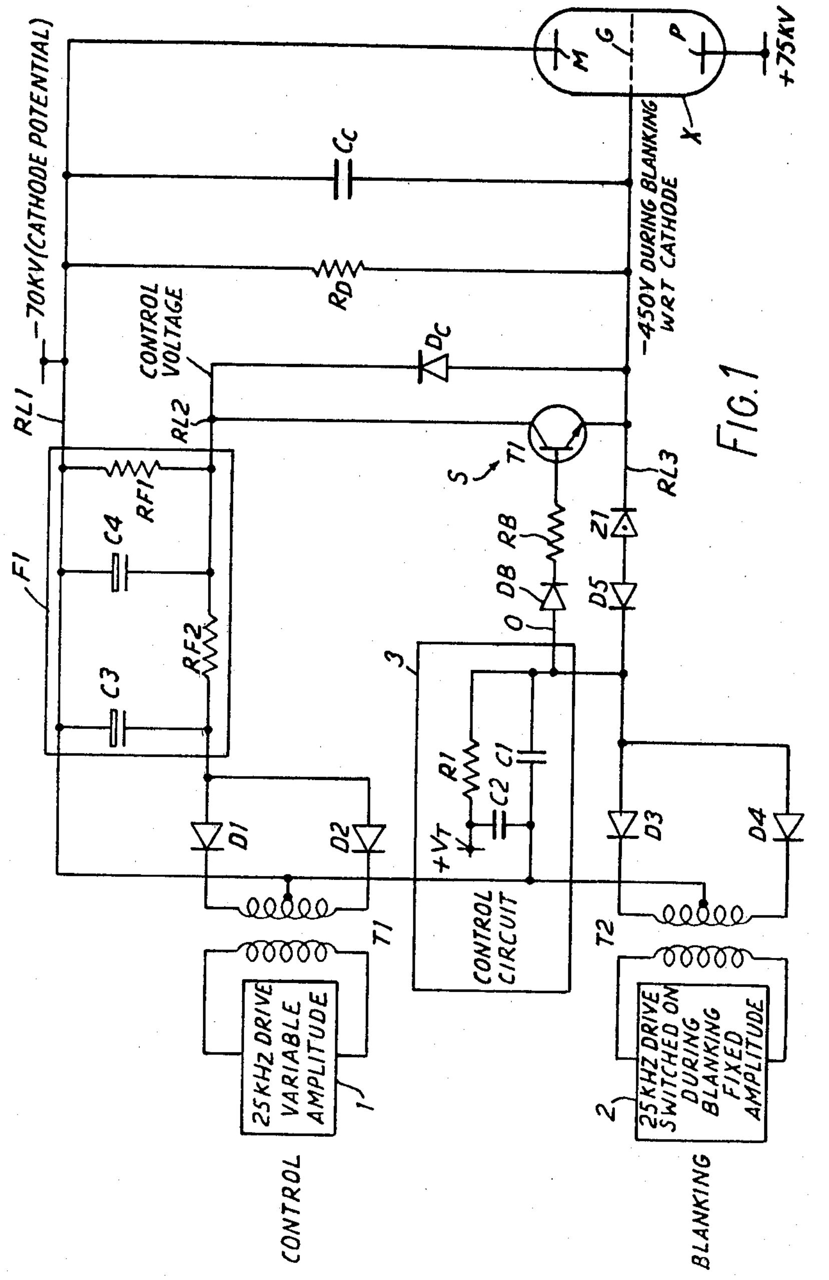
Figures 2A, 2B, 2C, 2D, 2E, 2F:
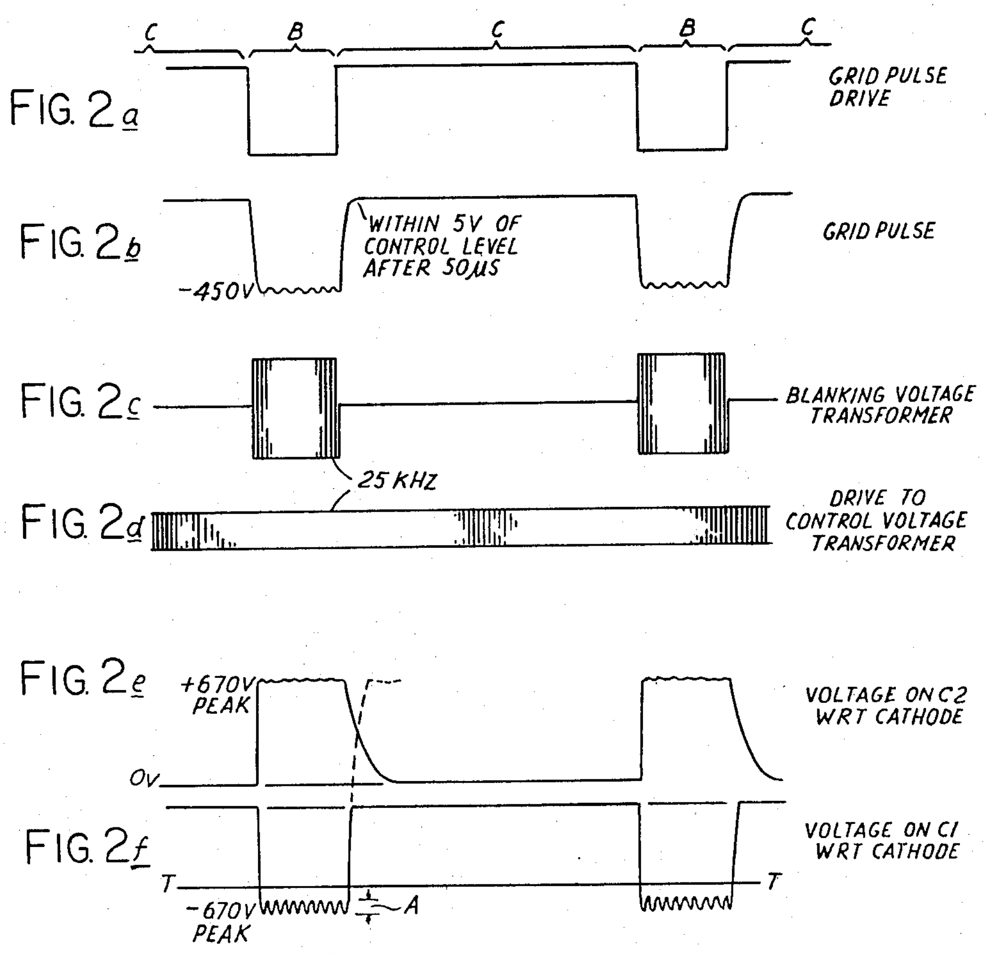
Figure 3:
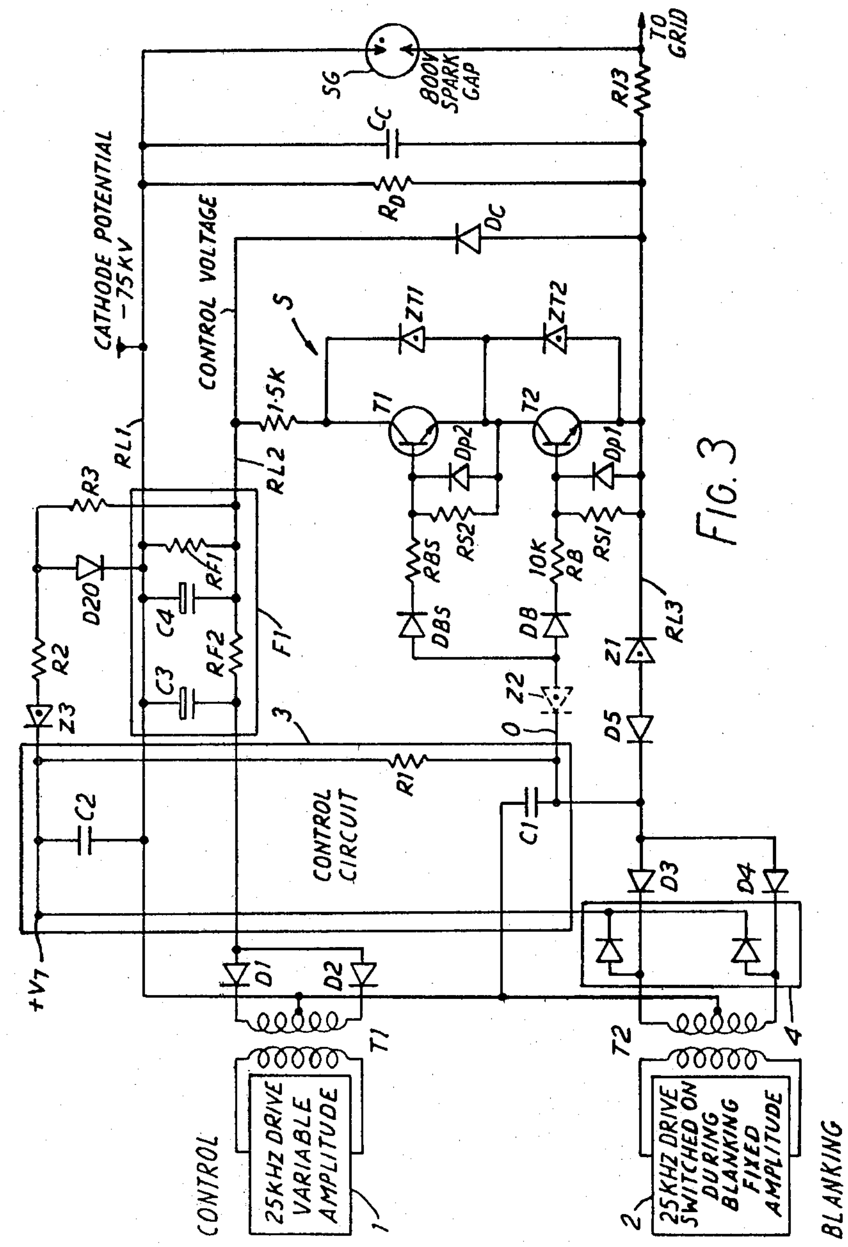

For a better understanding of the present invention, reference will now be made by way of example, to the accompanying drawings, in which:

FIG. 1 is a simplified diagram of a circuit in accordance with the invention,

FIGS. 2*a* through 2*f* comprise signal-amplitude-time diagrams explaining the operation of the circuit, and FIG. 3 is a diagram of a practical circuit in accordance with the invention.

The circuits shown in FIGS. 1 and 3 are intended for use with an X-ray tube X comprising an anode P, a cathode M for supplying electrons to the anode, and a control grid G between the cathode and anode P for pulse modulating the electron flow, so that the X-rays are pulsed. The circuits are arranged to provide a pulsed control voltage, which ideally is as shown in FIG. 2*a*, to the control grid. During the periods B, hereinafter referred to as "blanking" periods, the control voltage, is a fixed voltage called the "blanking" voltage e.g., −450 v, and is such as to cut-off the electron flow, whilst during the periods C, hereinafter referred to as "control" periods, the control voltage has a selectable amplitude, for example, −25 v to −450 v, to control the electron flow, the voltages being with respect to the cathode which is, for example, at −70 kV with respect to earth.

The circuits are connected to the X-ray tube via a long E.H.T. cable which is generally about 20 meters long and thus has a large capacitance which is represented in FIGS. 1 and 3 by capacitor $C_c$. In practice the cable comprises central filament leads surrounded by a grid conductor which in turn is surrounded by an earth screen. The capacitance of the cable comprises capacitance between the grid and filament and capacitance between the grid and earth. But for all practical purposes these capacitances may be represented by the single $C_c$. As explained hereinafter this capacitance $C_c$ presents problems in achieving the desired fast rise and fall times during the transitions from the control periods C to the blanking periods B and vice-versa.

The circuit of FIG. 1 includes a cathode potential rail RL1 which is maintained at −70 kV relative to earth. All voltages quoted hereinafter are measured with respect to the rail RL1. It also includes a control voltage rail RL2, and a blanking voltage rail RL3. The rail RL2 is coupled to the cable via a clamping diode $D_c$ and rail RL3 is coupled connected to the cable.

A 25 kHz variable amplitude drive circuit 1 is coupled to the control voltage rail RL2 via a transformer T1 and rectifiers D1, D2 to maintain the rail at −25 V to −450 V during both the control periods C and the blanking periods B. The AC voltage produced by circuit 1 is shown in FIG. 2*d*. A control voltage filter circuit F1, provides a smooth DC control voltage to the control grid of the X-ray tube during the control periods C.

A 25 kHz fixed amplitude drive circuit 2 is coupled to the blanking voltage rail RL3 via a transformer T2 and rectifiers D3, D4, which are connected via a diode D5 to a Zener diode Z1 which supplies the blanking voltage to the rail RL3. Because of the voltage drop across the Zener diode Z1, the drive circuit 2, transformer T2 and rectifiers D3, D4 produce a voltage (e.g. −670 V) greater than the blanking voltage which is for example −450 V. The reason for this will become clear hereinafter. The drive circuit 2 does not operate continuously like the circuit 1 but is periodically switched on (i.e. during the periods B); when the circuit 2 is switched on, the blanking voltage it produces on rail RL3 overrides the control voltage on rail RL2, reverse biassing the clamping diode $D_c$. The filter for the blanking voltage is provided only by a discharge resistor $R_D$ and the cable capacitor $C_C$ because more ripple can be tolerated during the blanking periods B than during the control periods C.

During the transition from control to blanking the cable capacitance $C_c$ is charged via a relatively low impedance path through the transformer $T_2$ and thus the time constant is short.

During the transition from blanking to control the capacitor $C_c$ must discharge from −450 V to the control voltage e.g. −25 V in a short time preferably, say, 50 μSec. The discharge resistor $R_D$ provides a path for discharging the capacitor $C_c$ but in order to provide a short enough discharge time constant its resistance must be less than 6.8 k which makes the ripple on the blanking voltage too high and at the same time places an intolerable load on the transformers T1 and T2.

In addition because the regulation of the transformers T1 and T2 is poor (due to loose coupling between the primary and secondary windings which are insulated to greater than 75 kV) ripple occurs on the rail RL2 as the discharge resistor $R_D$ switches in and out. Thus the resistor $R_D$ is of value 1 M in the example shown in FIG. 1, and in order to provide a low resistance discharge path for the capacitor $C_c$ an electronic switch S in the form of a transistor T1 is connected with its collector emitter path between the rails RL2 and RL3 and controlled in the following manner to control the discharge of the capacitor $C_c$.

The base of the transistor T1 is coupled via a resistor $R_B$ and a diode DB to a control circuit 3 comprising a capacitor C2 connected between a source $+V_T$ of positive potential relative to cathode potential and the cathode potential rail RL1, and a series arrangement of a resistor R1 and $C_1$ connected in parallel with the capacitor C2. The junction of the resistor R1 and capacitor C1 is connected to the base of transistor T1 via the diode $D_B$ and the resistor RB, and to the output of the rectifier circuit D3, D4. The source $+V_T$ is +670 V and is derived from the blanking transformer T2 via further rectifiers, which, for simplicity, are not shown in FIG. 1, and so the source $+V_T$ operates only when the blanking drive circuit 2 operates.

Referring to FIG. 2, the basic principle of operation of the control circuit is that capacitor C2 receives and stores the voltage $+V_T$ whilst it and the blanking voltage are generated. R1 and C1 define a short time constant for the discharge of C2 to control the switch-on of the discharge transistor T1, when the voltage $+V_T$ and the blanking voltage are not generated. With such a short time constant there is a 50 kHz ripple at the output O of the control circuit, when the blanking drive circuit 2 operates. The amplitude A of the ripple is a fairly large percentage of the blanking voltage (−450 V). The amplitude of this ripple is less than the voltage drop 220 V across the zener diode Z1 to ensure that transistor T1 is maintained in its non-conductive state during the blanking period B. When the blanking drive circuit is switched on, the peak voltage on the capacitance C1 is −670 V, and the transistor is non-conductive. When the blanking drive circuit 2 is switched off, the voltage on the capacitor C1 rapidly goes positive towards the +670 V of the source $+V_T$. When the potential at the base of transistor T1 reaches a threshold T which is more positive than the potential on rail RL3, e.g. more positive than −450 V, the cable capacitance having been discharged only slightly during this time by $R_D$, the transistor T1 becomes conductive and the potential on rail RL3 and the potential across the cable capacitor $C_c$ follows the discharge curve of capacitor C1 until the potential on rail RL2 is reached when transistor T1 becomes non-conductive again.

FIG. 2*e* shows the variation of voltage across capacitor C2. When the blanking drive circuit 2 is switched on, the voltage across C2 rises to +670 V and this voltage is maintained during the blanking period. The voltage then decays back to OV when the blanking drive circuit 2 is switched off.

C1 is chosen so that the ripple voltage on it is as large as can be tolerated, say, 150 v d.a.p. The higher the ripple voltage which can be tolerated, the shorter the discharge time of C1 and hence of the cable capacitance.

C2 is chosen so that the positive voltage on C2, established during blanking time, does not decay too rapidly during the blanking to control transition time as this would increase this time (R1 discharges C1 towards the positive potential on C2). However, at the same time C2 should not be so large that it affects the control voltage level during the control period by putting too much positive charge on the capacitors C3 and C4 of the filter F1. This occurs when C1 has been discharged to control voltage level and C2 is coupled via R1 and base circuit and junction of switch T1 to the control line. As some compensation the discharge of the cable capacitance puts negative charge on to the capacitors C3 and C4.

In the practical circuit of FIG. 3 the transistor T1 of FIG. 2 is replaced by a switch circuit S because of the high voltages involved. In the circuit S a series arrangement of two transistors T1 and T2 is connected between the rails RL2 and RL3. Zener diodes ZT1 and ZT2 are connected across the transistors to ensure that the potential across each transistor does not exceed its collector-emitter rating when switched off.

More than two transistors in series may be used if necessary. The transistors T1 and T2 may be replaced by Darlington transistors or, by MOS field effect transistors provided diodes $D_P$ are changed to Zener diodes (Zener voltage being sufficient to switch FETs hard on).

The circuit S may optionally be coupled to the output O of the control circuit 3 via a Zener diode Z2 (shown in dotted outline). When provided, this Zener diode increases the permissible ripple level at the output O.

FIG. 3 also shows the rectifier circuit 4 for deriving the voltage $+V_T$ for operating the control circuit 3, and a resistor R13 connecting rail RL3 to the cable, and a spark gap SG across the output.

Additionally, the practical circuit of FIG. 3 comprises a series arrangement of Zener diode Z3, a resistor R2 and a resistor R3 connected between the source $+V_T$ and the rail RL2, and a diode D20 connected between the junction of resistors R2 and R3 and the rail RL1. The purpose of these further components is as follows:

During the control periods C, when the blanking drive circuit 2 is switched off, the resistor R1 of the control circuit 3 is effectively connected across the rails RL1 and RL2, (i.e. in parallel with a load resistor RF1 of the control voltage filter F1), it being in a path from rail RL1 (OV with respect to the cathode potential) through transformer T2, rectifier 4, resistor R1, the base-circuits of the transistors T1 and T2 to rail RL2. In this situation R1 loads the filter F1. During the blanking periods B, when the blanking drive circuit 2 is switched on, the resistor R1 is effectively removed from loading the filter F1, which, in the absence the further components, would produce a ripple on the rail RL2. However, when capacitor C2 is charged during the blanking, the Zener diode Z3 and the diode D20 become conductive, putting the resistor R3 is parallel with the filter load resistor RF1, to compensate for the removal of resistor R1. In practice, the value of resistor R3 is slightly lower than the value of R1 to provide some compensation for the difference in the charge contributions of the capacitors C2 and $C_c$.

The components of the circuit of FIG. 3 may have the following design parameters.

Insulation of transformers T1 and T2 Greater than 75 kV

| | |
|---|---|
| $C_c$ | 8000 pF |
| $C_1$ | 1000 pF |
| $C_2$ | 0.005 μF |
| $C_3$ | 3.3 μF |
| $C_4$ | 3.3 μF |
| $R_D$ | 1M |
| RF1 | 20K |
| RF2 | 100 |
| R1 | 100K |
| R2 | 47K |
| R3 | 100K |
| RB, RBS, RS1, RS2 | 10K |
| Z1 | 220V |
| Z2 | 25V max. |
| Z3 | 330V |
| ZT1, ZT2 | 270V |
| T1, T2 | 2N 3439 |
| Cathode potential | −70 kV |
| Blanking voltage | −450V w.r.t. cathode |
| ripple | less than 10V |
| Control voltage | −25 to −450V w.r.t. to cathode |
| ripple | less than 100 mV |
| +Vr | +670V w.r.t. cathode |
| Control to blanking transition or vice versa | 50 μsec. |

The circuit described hereinbefore may be applied to a scanning X-ray tube in which the anode P is elongated, and the electron beam is deflected across the anode during the control periods C, the blanking periods B being provided for flyback.

What we claim is:

1. A circuit for producing a control voltage for application to a control grid interposed between an anode and a cathode of an X-ray tube to produce a pulse-modulated current flow in the tube, the circuit being for connection to the X-ray tube via a cable having a cable capacitance, and the circuit comprising:

a first voltage generator for generating a first voltage for regulating the said current flow;

a second voltage generator for periodically generating a second voltage for suppressing the said current flow;

an output for connection to the cable for connecting the circuit to the tube;

means connecting the output to the generators such that the second voltage, when generated, overrides the first voltage;

a discharge path connected across the output of the circuit to provide a discharge path for the discharge of the capacitance of the cable, the path including a controllable switching means connected between the outputs of the first and second voltage generators, means for deriving an actuating voltage from the second generator when the second voltage is produced; and a control means arranged to be actuated by the actuating voltage and responsive to the cessation of the second voltage to produce a control signal for controlling the switching means to complete the discharge path and define a desired transition between the application of the first and second voltages to the output of the circuit.

2. A circuit according to claim 1, wherein the control means produces a control signal the voltage of which varies in the manner in which it is desired that the voltage applied to the said output during the said transition time varies, and the switching means is such as to complete the discharge path in response to the control signal and to apply the voltage of the control signal to the said output during the said transition time, thereby to control the discharge of the capacitance of the cable.

3. A circuit according to claim 2, wherein the switching means comprises at least one transistor.

4. A circuit according to claim 3, wherein the, or each, transistor is a bipolar junction transistor, the emitter-collector path of which forms part of the discharge path.

5. A circuit according to claim 4, wherein the switching means comprises a plurality of transistors with the collector-emitter paths connected in series in the said discharge path.

6. A circuit according to claim 1, 2, 3, 4 or 5, wherein the control means comprises an input for receiving the actuating voltage, a first capacitor connected across that input to receive and store the actuating voltage when the second voltage is produced, and a series arrangement of a resistor and a second capacitor in parallel with the first capacitor, the junction of the resistor and second capacitor being connected to the switching means to apply the control signal thereto, and coupled to the output of the second generator at which the second voltage is produced to prevent production of the control signal while the second voltage is produced.

7. A circuit according to claim 1, 2, 3, 4 or 5, wherein the connecting means comprises a clamping diode for connecting the output of one of the generators to the output of the other of the generators.

8. A circuit for producing a control voltage for application to a control grid interposed between an anode and a cathode of an X-ray tube to produce a pulse-modulated current flow in the tube, the circuit comprising:

an output for connection via a cable to the X-ray tube, a reference potential conductor, coupled to one side of the output, a regulating voltage conductor, a suppression voltage conductor coupled to the other side of the output, a regulating voltage generator for continuously generating a regulating voltage for application to the regulating voltage conductor to regulate said current flow, a rectifying and filtering circuit connected to the regulating voltage conductor to apply the regulating voltage thereto, a regulating voltage transformer coupling the regulating voltage generator to the rectifying and filtering circuit, a suppression voltage generator for periodically generating a suppression voltage for application to the suppression voltage conductor to suppress the said current flow, a rectifying circuit connected to the suppression voltage conductor, to apply the suppression voltage thereto, a suppression voltage transformer coupling the rectifying circuit to the suppression voltage generator, a clamping diode coupling the regulating voltage conductor to the said other side of the output so that the suppression voltage, when generated, overrides the regulating voltage, a discharge path across the said output, the discharge path including at least one transistor the emitter-collector path of which is in the discharge path, and is connected between the regulating voltage conductor and the suppression voltage conductor, a further rectifying circuit for deriving an actuating voltage, from the suppression voltage transformer, when the suppression voltage is generated, a first capacitor connected between the further rectifying circuit and the reference potential conductor to receive and store the actuating voltage, a series arrangement of a resistor and a second capacitor connected in parallel with the first capacitor, and means coupling the junction of the resistor and second capacitor to the base of the transistor and to the suppression voltage conductor to apply the suppression voltage to the junction when it is generated.

* * * * *